United States Patent
Boyd et al.

(10) Patent No.: US 6,289,490 B1
(45) Date of Patent: Sep. 11, 2001

(54) OPTIMIZATION OF INTEGRATED CIRCUIT PROPERTIES THROUGH CONSTRAINTS USING A DOMINANT TIME CONSTANT

(75) Inventors: Stephen P. Boyd, Stanford; Abbas El Gamal, Palo Alto; Lieven Vandenberghe, Santa Monica, all of CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/169,905

(22) Filed: Oct. 8, 1998

Related U.S. Application Data

(60) Provisional application No. 60/063,968, filed on Oct. 31, 1997.

(51) Int. Cl.[7] ............................. G06F 17/50; G06F 17/10
(52) U.S. Cl. ........................................ 716/2; 716/6; 703/2
(58) Field of Search .............................. 716/2, 6, 19, 18, 716/1, 3, 4; 703/14, 15, 16, 17, 18, 19, 2, 13; 395/500.02, 500.03, 500.04, 500.19, 500.35, 500.36, 500.37

(56) References Cited

U.S. PATENT DOCUMENTS

| | | | |
|---|---|---|---|
| 4,630,219 | * 12/1986 | DiGiacomo et al. | 716/9 |
| 4,827,428 | 5/1989 | Dunlap et al. | 716/6 |
| 5,303,161 | * 4/1994 | Burns et al. | 716/9 |
| 5,379,231 | 1/1995 | Pillage et al. | 703/14 |
| 5,453,991 | * 9/1995 | Suzuki et al. | 714/724 |
| 5,758,148 | * 5/1998 | Lipovski | 711/106 |
| 5,818,729 | * 10/1998 | Wang et al. | 707/9 |
| 5,910,899 | * 6/1999 | Barrientos | 716/8 |
| 6,064,809 | * 6/1998 | Braatz et al. | 716/8 |

OTHER PUBLICATIONS

Vandenberghe, V. et al., Semidefinate Programming, SIAM Review, 38, pp. 49–95, 1996.
Boyd, Stephen et al., Method of Centers for Minimizing Generalized Eigenvalues, Linear Algebra and Appl., 188, pp. 63–111, 1993.
Vandenberghe, V. et al., Optimizing Dominant Time Constant in RD Circuits, IEEE Transactions in Computer Aided Design, 17, pp. 110–125, Feb. 1998.
Optimal Wire and Transistor Sizing for Circuits with Non-–Tree Topolgy, Proceedings of ICCAD '97, Nov. 9–13, 1997 in San Jose, California, pp. 252–259.

* cited by examiner

*Primary Examiner*—Matthew Smith
*Assistant Examiner*—Leigh Marie Garbowski
(74) *Attorney, Agent, or Firm*—Lumen Intellectual Property Services

(57) ABSTRACT

A method for optimizing an integrated circuit uses a dominant time constant of a transition of the circuit. A physical layout of the circuit is characterized in terms of design parameters. The circuit is modeled by a conductance matrix G and a capacitance matrix C, wherein G and C are affine functions of the design parameters. The optimization method comprises the step of finding the values of the design parameters that optimize a property of the circuit while simultaneously enforcing a constraint that the dominant time constant must be less than a maximum value $t_{max}$. Mathematically, the constraint on the dominant time constant can be written: $t_{max} G - C \geq 0$. The optimization method can be used when the circuit has a non-tree topology. Furthermore, when the design parameters comprise variables that relate to sizes of elements of the circuit, a topology of the circuit is optimized by the optimization method. In some embodiments the circuit is optimized for a plurality of transitions, and in some embodiments the design parameters are subject to design constraints.

26 Claims, 8 Drawing Sheets

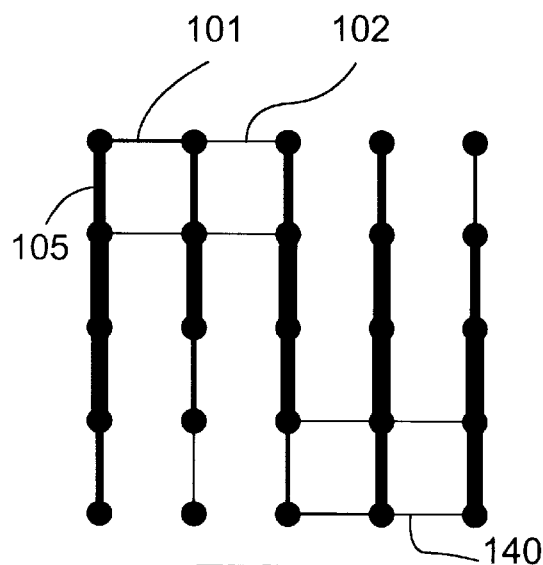
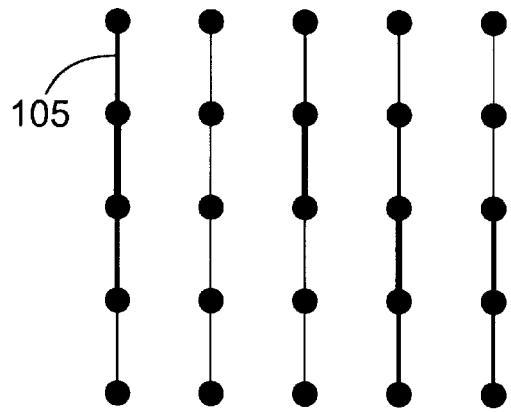
FIG. 5a  FIG. 5b
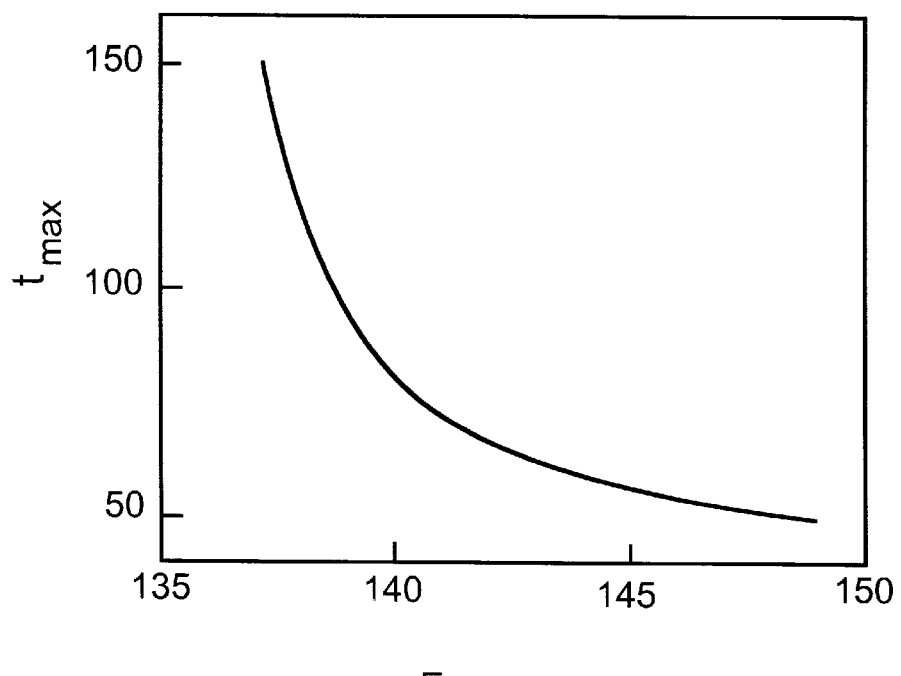
FIG. 6

OPTIMIZATION OF INTEGRATED CIRCUIT PROPERTIES THROUGH CONSTRAINTS USING A DOMINANT TIME CONSTANT

RELATED APPLICATION DATA

This application is based on provisional patent application No. 60/063,968, filed on Oct. 31, 1997. The above provisional patent application is herein incorporated by reference.

This invention was made with the support of the National Science Foundation and the Air Force Office of Scientific Research. The U.S. Government has certain rights in this invention.

FIELD OF THE INVENTION

The present invention generally relates to integrated circuits, and more specifically to a method that uses a dominant time constant of an integrated circuit to optimize the circuit with respect to certain properties.

BACKGROUND

Because of the rapid growth rate of the electronics industry, each year integrated circuits are required to be smaller, more dense, and faster than before. Integrated circuits can be extremely complex, with millions of transistors on a single chip. Typically one needs to minimize some property of the circuit—for example, the size of the circuit or the power dissipated by the circuit—while preserving a rapid response time. Optimizing the circuit in the face of the extreme complexity of the circuit is therefore a difficult problem.

The integrated circuit constantly undergoes transitions in which some of the active elements of the circuit change state from a logical "low" to a logical "high," and other elements change from "high" to "low." After one such transition takes place, some time must elapse for the remainder of the circuit to equilibrate before another transition can occur. The amount of time that must elapse is the response time of the circuit, and this response time in general depends on the transition. When attempting to optimize the circuit, the transition corresponding to the slowest response time, or else several transitions simultaneously, are considered.

Conventional approaches to the optimization problem estimate the response time of the circuit by the Elmore delay of one or more transitions of the circuit. Such approaches are disclosed, for example, in Pillage, Ratzlaff, and Gopal, U.S. Pat. No. 5,379,231, and in Dunlop and Fishburn, U.S. Pat. No. 4,827,428. Sizes of elements of the circuit are optimized with respect to a certain property of the circuit, while keeping the Elmore delay suitably small. A severe limitation of these methods, however, is that the Elmore delay cannot be used for a circuit that has a non-tree topology. In other words, if the circuit has loops, the above methods cannot be used.

A typical solution is to simply ignore the non-tree nature of the circuit, and use the Elmore delay methods anyway. In this approach, circuit interconnects that form loops in the circuit are ignored during the optimization procedure. However, as the circuits get smaller and smaller, crosstalk between the elements becomes increasingly import ant. Because of the crosstalk, the circuits effectively comprise loops, even if the circuits are manufactured with an intended tree topology. Pre sent methods do not allow the crosstalk, or any other loops, to be taken into account when designing an optimum layout of the circuit.

Another disadvantage of the conventional methods is that the topology of the circuit must be fixed in advance, and cannot be determined as part of the optimization procedure. It is desirable to have a method for designing integrated circuits that not only optimizes the sizes of the elements, but determines which connections are necessary and which should be omitted in the optimum case. Such flexibility is not possible when the Elmore delay methods are used.

OBJECTS AND ADVANTAGES

It is therefore a primary object of the present invention to provide a method for finding an optimum design for a circuit, where the method is effective even when the circuit has a non-tree topology. It is another object of the invention to provide a method for finding an optimum topology of the circuit. Other objects of the invention are to provide an optimization method wherein a plurality of transitions of the circuit can be considered simultaneously, and wherein constraints on the physical layout of the circuit can be incorporated. These objects yield a method that has the advantage that circuits may be more accurately modeled and their design more effectively optimized, whereby integrated circuits of improved performance may be manufactured.

SUMMARY

A method for optimizing an integrated circuit employs a dominant time constant of a transition of the circuit as an estimate for the response time of the circuit. A physical layout of the circuit is characterized in terms of design parameters. The design parameters relate, for example, to sizes of elements of the circuit, or to spacings between the elements. The method comprises the step of finding the values of the design parameters that optimize a property of the circuit while simultaneously keeping the dominant time constant below some pre-selected maximum $t_{max}$. The property optimized is typically a size of the circuit, an energy dissipated by a transition of the circuit, or the dominant time constant itself.

The above step of optimizing the property while keeping the dominant time constant below $t_{max}$ presents a complicated problem in linear algebra that has only in recent years become tractable. Recently developed mathematical tools have made it possible to carry out the above step using a conventional digital computer. The mathematical tools are known as semi-definite programming and generalized eigenvalue minimization. To use these tools, the circuit is modeled by a conductance matrix G and a capacitance matrix C, where matrices G and C are affine functions of the design parameters.

The optimization method can be used even when the circuit has a non-tree topology. Furthermore, when the design parameters comprise variables that relate to sizes of elements of the circuit, the topology of the circuit is optimized by the optimization method, the optimum topology being dictated by those elements whose optimum size is zero.

In some embodiments, a plurality of transitions is considered. In these embodiments, the optimization method comprises the step of optimizing the property while requiring that dominant time constants for a set of transitions are all simultaneously less than the maximum value $t_{max}$. In some embodiments, the design parameters are subject to design constraints.

BRIEF DESCRIPTION OF THE DRAWINGS

FIGS. 5a and 5b illustrate results of the optimization method applied to the equivalent circuit of FIG. 3.

FIG. 6 shows a tradeoff curve of the optimization method applied to the equivalent circuit of FIG. 3.

DETAILED DESCRIPTION

A method for optimizing a circuit is described. In the preferred embodiments, the circuit is a digital integrated circuit comprising transistors and interconnect wires. A first step of the method is to represent the circuit by an equivalent circuit that comprises resistors, capacitors, and voltage sources. Techniques for representing the circuit by the equivalent circuit are well known in the art. In the preferred embodiments, the equivalent circuit is an interconnected circuit that has loops; that is, the equivalent circuit has a non-tree topology.

Figure 1:
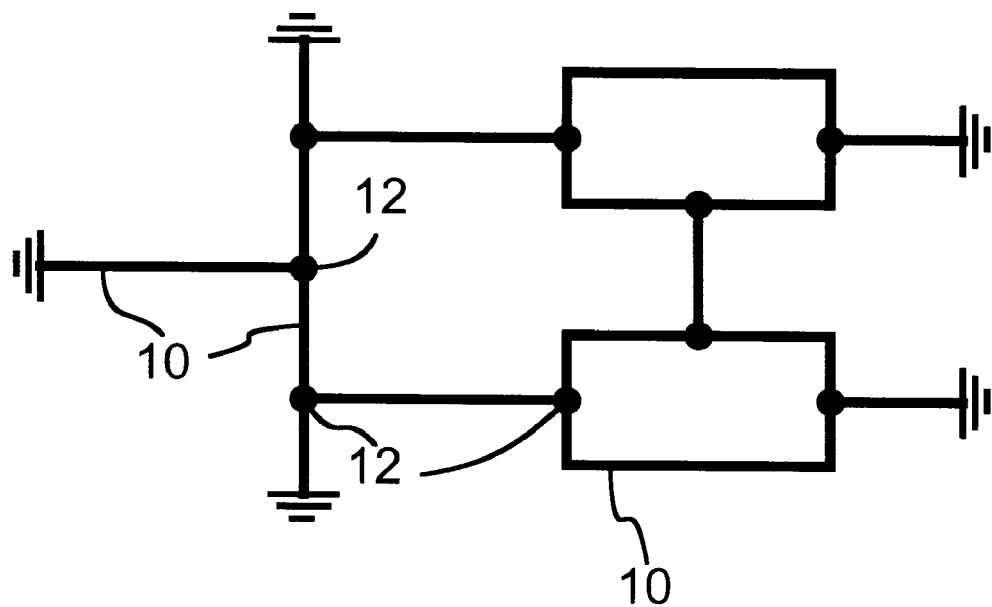
FIG. 1 shows an example of an equivalent circuit of the type used in a method for optimizing a circuit. The equivalent circuit comprises branches and nodes.

For purposes of example and to provide a better understanding of the method, FIG. 1 shows a representative equivalent circuit. The equivalent circuit comprises branches 10 and nodes 12. Nodes 12 are intersection points of branches 10. The equivalent circuit of FIG. 1 has sixteen branches; however, in the primary embodiment of the optimization method, the equivalent circuit comprises hundreds of thousands of branches. FIG. 1, therefore, appears for purely illustrative purposes. Branches 10 model elements of the circuit, such as interconnect wires and transistors, as well as crosstalk between the elements.

Figure 2:
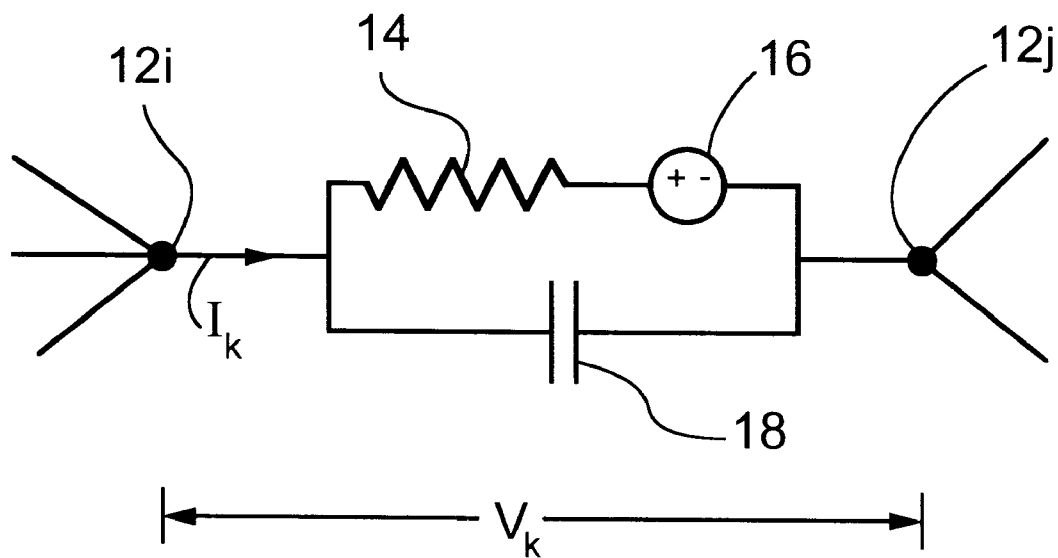
FIG. 2 is a schematic diagram of a branch of the equivalent circuit of FIG. 1.

Branches 10 are numbered from to N, where N is the total number of branches. Nodes 12 are numbered from 1 to n, where n is the total number of nodes. FIG. 2 shows a model of a $k^{th}$ branch of the equivalent circuit of FIG. 1, where $1 \leq k \leq N$. The $k^{th}$ branch is modeled by a resistor 14, a voltage source 16, and a capacitor 18. Resistor 14 has a conductance $g_k$. (Recall that conductance is the reciprocal of resistance.) Voltage source 16 supplies a voltage $U_k$, and capacitor 18 has a capacitance $c_k$. The conductance $g_k$, the capacitance $c_k$, or the voltage $U_k$ may be equal to zero; or two of these three quantities may be equal to zero; or all three quantities may be equal to zero.

In the preferred embodiments of the optimization method, the circuit optimized is an integrated digital circuit. The circuit is optimized for one or more transitions of the circuit.

The values of conductance $g_k$ and capacitance $c_k$ depend on the transition considered. For example, if the kth branch models a transistor in the "on" state, the $k^{th}$ branch has a conductance $g_k>0$. If the $k^{th}$ branch models a transistor in the "off" state, the $k^{th}$ branch has a conductance $g_k=0$. In the present discussion, the quantities $g_k$, $C_k$, and $U_k$ correspond to a first transition of the circuit.

The $k^{th}$ branch of FIG. 2 lies between an $i^{th}$ node 12i, and a $j^{th}$ node 12j. A current $I_k$ flows through the $k^{th}$ branch, and a voltage $V_k$ exists across the $k^{th}$ branch. The voltage $V_k$ is defined as $V_k=V_{i-vj}$, where $v_i$ is a voltage at $i^{th}$ node 12i, and $v_j$ is a voltage at $j^{th}$ node 12j. From Ohm's Law and the definition of capacitance, it follows that the current $I_k$ is related to the voltage $V_k$ by $$I_k=c_k(dV_k/dt)+g_k(V_kU_k) \quad (1)$$

Eq. (1) is cast in a more convenient form by introducing a node-incidence matrix B, well known in the art. Matrix B is an n×N matrix that indicates how the branches of the equivalent circuit are connected to the nodes. A branch voltage vector V is defined as an N-component column vector whose $k^{th}$ component is voltage $V_k$. A node voltage vector v is defined as an n-component column vector whose $i^{th}$ component is voltage $v_i$. The branch and node voltage vectors are related by the matrix B as follows: $V=B^T v$. ($B^T$ is the transpose of matrix B.) A branch current vector I is defined as an N-component vector whose $k^{th}$ component is current $I_k$. Kirchhoff's law expressing the conservation of current, in this notation, reads: BI=0.

A capacitance matrix C is defined by $C=B\ diag(c)\ B^T$, where diag(c) is an N×N diagonal matrix whose (k,k) component is $C_k$. Similarly, a conductance matrix is defined by $G=B\ diag(g)\ B^T$, where diag(g) is an N×N diagonal matrix whose (k,k) component is $g_k$. An n-component source voltage vector u is defined as $u=G^{-1} B\ diag(g)\ U$. With these definitions, Eq. (1) may be rewritten as:

$$C(dv/dt)=-G(v-u). \quad (2)$$

Note that matrices G and C are symmetric matrices.

The first transition of the circuit is modeled as follows. For time t<0, the circuit is assumed to be in a steady state, with $u=v=v_-$, where $v_-$ is some constant vector. At time t=0, the source voltage vector u switches to a new constant value, $v_+$. It follows from Eq. (2) that the voltage vector v does not immediately respond to the change in u, but approaches the new value $v_+$ as time t progresses:

$$v=v_++(v_--v_+)\exp(-C^{-1}G_t) \quad (3)$$

The components vi of the vector v approach their final values $v_{+i}$ with various response times. The overall response of the circuit is limited by the slowest response time, called the "dominant time constant." The response times are related to the eigenvalues of the matrix $C^{-1}G$ that appears in Eq. (3) above. Let the smallest eigenvalue of the matrix $C^{-1}G$ be called $\lambda_s$. Then the dominant time constant $T_{dom}$ is given by: $T_{dom}=1/\lambda_s$.

An upper bound on the dominant time constant may be obtained as follows. If a number T satisfies the equation $$TG-C \geq 0 \quad (4)$$

then $T_{dom} \leq T$. Some care must be used in interpreting Eq. (4). Since G and C are matrices, Eq. (4) means that all of the eigenvalues of the matrix T G−C are greater than or equal to zero.

The conductances and capacitances of the equivalent circuit, given by the matrices G and C, respectively, depend on design parameters of the circuit. In the preferred embodiments, each design parameter is related to a physical dimension of an element of the circuit, or to a spacing between two elements. For example, the design parameters may comprise widths of interconnect wires. The design parameters are denoted $x_1, x_2, \ldots x_M$, where m is the total number of design parameters. The design parameters are collectively symbolized by a vector x, whose $i^{th}$ component is $x_i$. The conductance and capacitance matrices are functions of the design parameters: $G=G(x)$, and $C=C(x)$.

The matrices G and C depend on the design parameters $x_i$ in a particular way: both G and C are affine functions of the design parameters. When a matrix M is an affine function of the design parameters $x_i$, then by definition, matrix M can be written in terms of matrices $M_0, M_1, \ldots, M_m$ as follows:

$$M=M_0+M_1x_1+M_2x_2+\ldots+M_mx_m$$

where the matrices $M_0, M_1, \ldots, M_m$ do not depend on the design parameters.

The circuit is optimized with respect to a property P of the circuit, subject to the constraint that the dominant time constant does not exceed an upper bound, or maximum dominant time constant, $t_{max}$. Using $T=t_{max}$ in Eq. (4) provides a concise statement that the dominant time constant does not exceed $t_{max}$. A first embodiment of the optimization method, then, comprises the following step:

optimize P, subject to the constraint $t_{max}G(x)-C(x)\geq 0$. (5)

To optimize P is to find values of the design parameters that optimize P.

In some embodiments, the property P is an affine function of the design parameters; that is, $P=b^Tx+c$ for some m-component vector b and a constant c. In these embodiments, property P is minimized. Semi-definite programming techniques are used to numerically carry out the step of Eq. (5). Using these techniques, the design parameters $x_i$ are found Semi-definite programming is a set of techniques used to determine the values of a set of parameters that minimize a cost function subject to the constraint that one or more symmetric matrices are positive semi-definite, where the cost function and all the elements of the matrices are affine functions of the parameters. In the present case, the cost function is the property P. Several methods for semi-definite programming are described in the literature on nonlinear optimization; see for example L. Vandenberghe and S. Boyd, *Semidefinite Programming*, SIAM Review 38 (1996) pp. 49–95. These algorithms are iterative procedures that start with an initial value of the parameters, and improve the values until a specified accuracy is obtained. In the present method, the design parameters are frequently subject to constraints (see below), and in such cases, the initial value for each design parameter is frequently chosen to be the average of the allowed upper and lower bounds.

In one class of semi-definite programming methods—called interior point methods—the successive iterates are determined by applying Newton's method to solve a set of nonlinear equations that characterize parameters that satisfy the constraints, and have a value of the cost function within a given accuracy of the optimal value. In a second class of methods—called cutting-plane methods—the optimal point is approximated by generating smaller and smaller convex sets that are guaranteed to contain the optimal values.

In some embodiments, the property P is $t_{max}$ itself. In these embodiments, the design parameters that minimize the maximum dominant time constant are found, so that $t_{max}$ takes on its minimum possible value $(t_{max})_{min}$. It can be shown that $(t_{max})_{min}$ is equal to the dominant time constant $T_{dom}$ of the optimized circuit. That is, when property P is $t_{max}$, the dominant time constant of the circuit is minimized, and its value is equal to the minimum value of $t_{max}$ that is found. In these embodiments, generalized eigenvalue minimization techniques are used to carry out the step of Eq. (5).

Generalized eigenvalue minimization refers to techniques used to determine the values of parameters that minimize the maximum eigenvalue of a pair of symmetric matrices, where the elements of both matrices are affine functions of the parameters. Several methods for generalized eigenvalue minimization are described in the optimization literature; see for example S. Boyd and L. El Ghaoui, *Method of Centers for Minimizing Generalized Eigenvalues*, Linear Algebra and Applications, special issue on Numerical Linear Algebra Methods in Control, Signals and Systems, 188 (1993) pp. 63–111. The simplest method is to apply a bisection procedure to find the optimum within a specified accuracy. Each step of the bisection method reduces to solving a semi-definite programming problem, to determine whether a proposed value is an upper or lower bound for the minimum value of the maximum eigenvalue.

The fact that matrices G and C are affine functions of the design parameters allows the techniques of semi-definite programming and generalized eigenvalue minimization to be used in the step of Eq. (5). Because of the large size of the circuits optimized in the preferred embodiments of the method, the step of Eq. (5) is preferably performed using a digital computer. For more information on carrying out the step of Eq. (5), see the following articles by Lieven Vandenberghe, Stephen Boyd, and Abbas El Gama, which are herein incorporated by reference: *Optimizing Dominant Time Constant in RC Circuits*, IEEE Transactions on Computer Aided Design, Vol. 17, 110–125 (1998), and *Optimal Wire and Transistor Sizing for Circuits with Non-tree Topology*, Proceedings of ICCAD'97, Nov. 9–13, 1997 in San Jose, Calif., pages 252–259.

The design parameters $x_i$ are related to a physical layout of the circuit. In some embodiments, the design parameters comprise dimensions of a set of elements of the circuit. Examples where the design parameters comprise widths of a set of elements of the circuit are given below in Examples 1–5. In some embodiments, the design parameters comprise quantities that are related to, but not equal to, dimensions of a set of elements of the circuit. In some embodiments, the design parameters comprise quantities that are related to, but not equal to, spacings between elements of the circuit. In each case, capacitance matrix C and conductance matrix G are affine functions of the design parameters.

In some embodiments, for instance, capacitance matrix C is not an affine function of a spacing s between two elements of the circuit. Matrix C is, however, an affine function of a variable t, where $t=1/s$. In these embodiments, the design parameters $x_i$ comprise variable t, but not s, so that capacitance matrix C is an affine function of the design parameters. The present method can be used whenever design parameters can be defined such that matrices G and C are affine functions of the design parameters. A more detailed example is given by Example 5, below.

In some embodiments, the design parameters $x_i$ are subject to design constraints, in addition to the constraint $t_{max}G-C \geq 0$. Any number of design constraints may be accommodated, as long as the design constraints can be formulated as a linear matrix inequality. A linear matrix inequality is an equation of the form:

$$A(x) \geq 0 \qquad (6)$$

where A is a symmetric matrix that is an affine function of the design parameters $x_i$. The above references, *Semidefinite Programming and Method of Centers for Minimizing Generalized Eigenvalues* explain how the design constraints expressed as a linear matrix inequality are incorporated into the optimization techniques.

An arbitrary number q of linear matrix inequality design constraints may be utilized by the optimization method. Constraints $A_1 \geq 0$, $A_2 \geq 0$, ..., $A_q \geq 0$ defined by matrices $A_1, A_2, \ldots, A_q$ are combined into the single equation $A \geq 0$ by requiring the matrix A to have a block diagonal form, with entries equal to $A_1, A_2, \ldots, A_q$.

An example of design constraints is a requirement that each design parameter $x_i$ lie within a specified range between a minimum value xmin and a maximum value $x_{max}$. The additional constraints, $x_{min} \leq x_i \leq xmax$, may be written as:

$$x_{max} - x_i \geq 0;$$

$$x_i - x_{min} \geq 0$$

These design constraints may be expressed by the linear matrix inequality of Eq. (6) by constructing matrix A to be a 2m×2m diagonal matrix whose diagonal entries are $x_{max} - x_i$ and $x_i - x_{min}$.

Other design constraints may be used. In some embodiments the design constraints $A \geq 0$ comprise an upper bound or a lower bound, or both, on an area of the circuit; see Example 4. In some embodiments, the design constraints comprise a bound on a width of the circuit. As another example, the design constraints may comprise a bound on an energy dissipated by the circuit.

A second embodiment of the optimization method, therefore, includes design constraints and comprises the following step:

optimize property P, subject to the constraint $t_{max}G(x) - C(x) \geq 0$, and to the constraints $A(x) \geq 0$ (7)

where $A(x) \geq 0$ is a linear matrix inequality that expresses design constraints.

In the foregoing discussion, matrices G and C model conductances and capacitances for the first transition of the circuit. A second transition may similarly be modeled by a conductance matrix $G^{(2)}$ and a capacitance matrix $C^{(2)}$. A third transition may be modeled by $G^{(3)}$ and $C^{(3)}$, and so on. The optimization method may be applied to more than one transition, so that the circuit is optimized for any number of transitions simultaneously. That is, in a third embodiment of the optimization method, the method comprises the following step:

optimize P, subject to $t_{max}G(x) - C(x) \geq 0$, $t_{max}G^{(2)}(x) - C^{(2)}(x) \geq 0$,

...

$t_{max}G^{(r)}(x) - C^{(r)}(x) \geq 0$ (8)

where r is an integer greater than one that specifies the desired number of transitions. Each matrix $G^{(j)}$ and $C^{(j)}$, for $j=2, \ldots, r$, is an affine function of the design parameters $x_i$.

In a fourth embodiment of the optimization method, the circuit is optimized for a plurality of transitions, and the circuit is also subject to design constraints. The method comprises the step:

optimize property P, subject to the constraints: $t_{max}G(x) - C(x) \geq 0$, $t_{max}G^{(j)}(x) - C^{(j)}(x) \geq 0$, $j=2 \ldots r$, $A(x) \geq 0$. (9)

In the first and the third embodiments of the method, if $P \neq t_{max}$, it is preferred that the step of optimizing P (Eq. (5) for the first embodiment, Eq. (8) for the third) is repeated a number of times, each time with a different value of $t_{max}$, to observe the sensitivity of the optimum design parameters to variations in $t_{max}$. In the second and fourth embodiments, it is preferred that the step of optimizing P (Eq. (7) for the second embodiment, Eq. (9) for the fourth) is repeated numerous times, each time with a different value of $t_{max}$, or with different design constraints on the parameters $x_i$, or both. This allows one to determine the sensitivity of the optimum design parameters to variations in the design constraints and, when $P \neq$, to variations in $t_{max}$.

Property P is a property of the circuit. In some embodiments, property P is a physical property of the circuit. For example, in some embodiments P is a width of the circuit, and in some embodiments P is an area of the circuit. Example 5, below, gives an embodiment where P is the width of the circuit. When P is the area of the circuit, typically the circuit has at least m interconnect wires, each wire having a length $l_i$ and width $w_i$, where $i=1, 2, \ldots, m$. In certain embodiments, the lengths $l_i$ are held fixed and the widths $w_i$ are to be optimized. In these cases, the design parameters $x_i$ comprise widths $w_i$: $x_i = w_i$ for $i=1, 2, \ldots, m$. Property $P = a_o + x_1 l_1 + x_2 l_2 + \ldots + x_m l_m$ where $a_o$ is an area of a fixed part of the circuit. (Of course, since $a_o$ is a constant, it need not be included: one may use $P = x_1 l_1 + x_2 l_2 + \ldots + x_m l_m$ and achieve the same result.)

In other embodiments, property P is a performance characteristic of the circuit. For example, in some embodiments P is the maximum dominant time constant $t_{max}$, and in some embodiments P is an energy E dissipated by one transition of the circuit. Energy E is given by: $E = (\frac{1}{2})(v_+^T C v_+ - v_-^T C v_-)$. A detailed example where P=E is given by example 3, below. It should be noted, however, that property P need not be limited to the examples discussed here; P may be any property of the circuit that can be expressed as an affine function of the design parameters.

In many embodiments of the optimization method, an $i^{th}$ element of the circuit is modeled by the $i^{th}$ branch of the equivalent circuit and characterized by a size $y_i$. The design parameters $x_i$ comprise variables that relate to the sizes $y_i$. After the step of optimizing P is carried out, it may turn out that the optimum size $y_i$ of the $i^{th}$ element is zero. When this is the case, the $i^{th}$ element optimally does not exist. Therefore, not only the sizes of the elements but the very existence or absence of elements of the circuit is optimized by the method. That is, a topology of the circuit is optimized by the method. Typically the equivalent circuit, as illustrated by FIG. 1, has a more general topology than the resultant optimal circuit, since some of branches 10 will turn out to have an optimum size of zero.

In many embodiments, therefore, the optimization method can be restated in the following way. The method is a method for optimizing the topology of the circuit, wherein the method comprises the step of finding values of the design parameters that optimize property P provided $t_{max} G(x) - C(x) \geq 0$ and wherein the design parameters $x_i$ comprise variables that relate to physical dimensions of a set of elements of the circuit. An optimum topology of the circuit is determined by the optimum values of the design parameters. As before, the design parameters may also be subject to additional constraints $t_{max} G^{(j)}(x) - C^{(j)}(x) \geq 0$, for $j=2, \ldots, r$, or design constraints $A(x) \geq 0$ or both. The topology of the circuit is optimized in examples 3 and 4, below.

The following examples of the optimization method are intended to clarify the method by illustration, but are not to be construed as limitations of the method.

Example 1: The design parameters are widths of interconnect wires that are modeled by a set of branches 10. The design parameter $x_i$ is a width of the $i^{th}$ branch. An area of the circuit is to be minimized. The area is equal to $a_o + x_1 l_1 + \ldots + x_m l_m$, where $a_o$ is an area of a fixed part of the circuit, and $l_i$ is a length of the $i^{th}$ branch. The lengths $l_i$ are fixed. Each branch is to have a minimum width $x_{min}$ and a maximum width $x_{max}$. A value of the maximum dominant time constant $t^{max}$ is chosen. The method for optimizing the circuit comprises the step of:

using semi-definite programming techniques to minimize $$\sum_{i=1}^{m} l_i x_i,$$

where the $x_i$ are subject to the constraint $t_{max} G - C \geq 0$ and to the constraints $x_{min} \leq x_i \leq x_{max}$, for $i=1, \ldots, m$.

This step is carried out for a number of values of $t_{max}$ to determine the sensitivity of the optimum area of the circuit to $t_{max}$.

Example 2: The design parameters are the same as in example 1. In this case however, the dominant time constant is minimized, subject to a condition that the area of the circuit does not exceed a critical area $a_c$. The method for optimizing the circuit comprises the step of:

using generalized eigenvalue minimization techniques to find the widths $x_i$ that minimize $t_{max}$, where $t_{max}$ and $x_i$ are subject to the following constraints:

$$t_{max} G - C \geq 0,$$

$$\sum_{i=1}^{m} l_i x_i \leq a_c, \text{ and}$$

$$x_{min} \leq x_i \leq x_{max}, \text{ for } i = 1, 2, \ldots m.$$

This step is carried out for several different values of $a_c$ to determine the sensitivity of the minimum value of $t_{max}$ to the critical area $a_c$.

Figure 3:
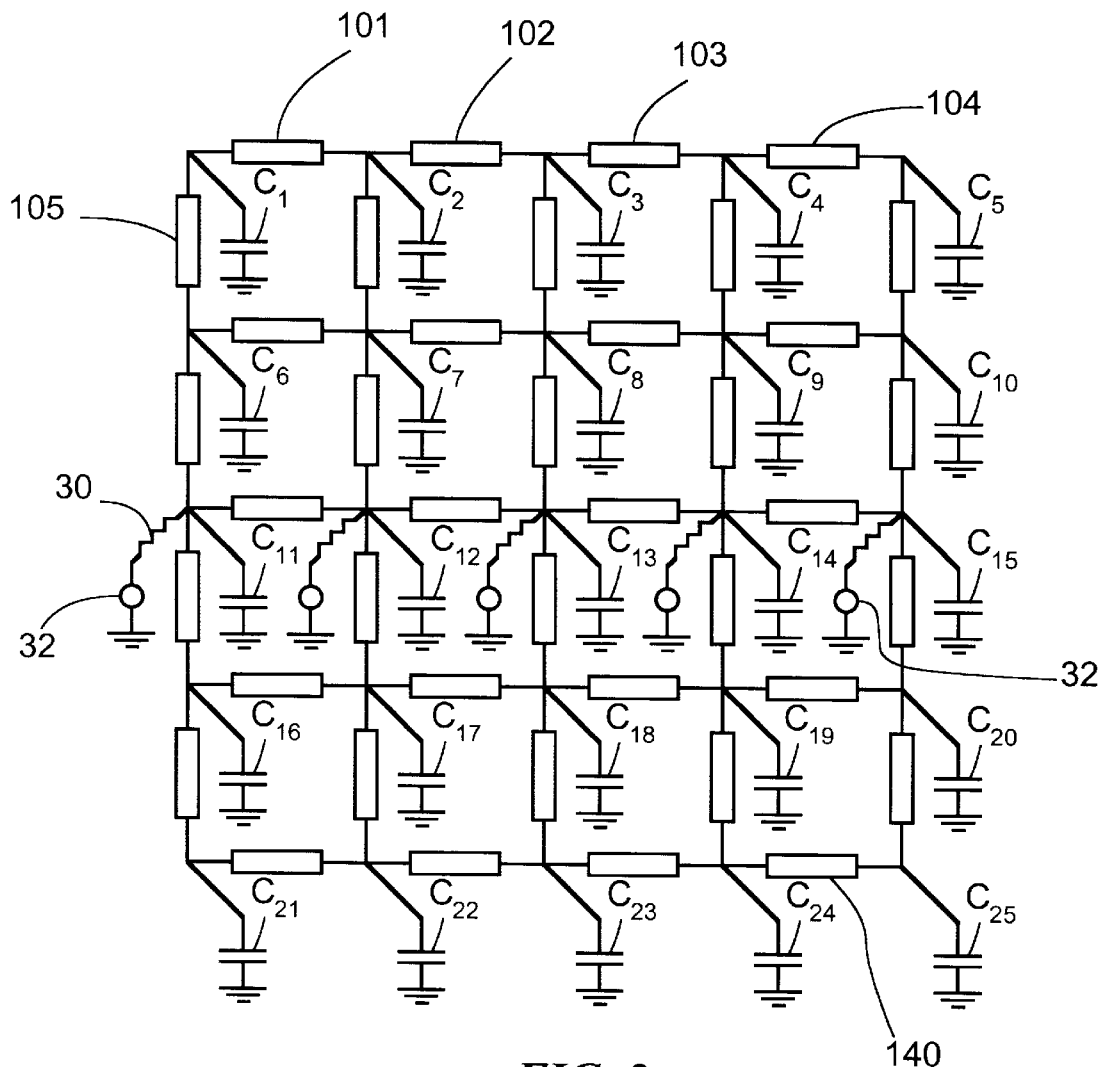
FIG. 3 shows an example of an equivalent circuit comprising a mesh of segments.
Figure 4:
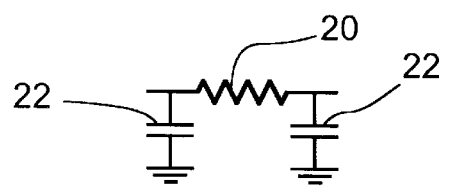
FIG. 4 is a schematic diagram of a segment of the equivalent circuit of FIG. 3, and of a connector of an equivalent circuit of FIG. 7.

Example 3: The circuit is a mesh. The equivalent circuit is shown in FIG. 3. The equivalent circuit comprises forty segments; six of the segments are labeled in FIG. 3 as 101, 102, 103, 104, 105, and 140. Each segment is modeled as shown in FIG. 4 by a resistor 20 and two capacitors 22. Note that each segment comprises three branches. Segment 101 has width $x_1$; segment 102 has width $x_2$, and so on. For a segment having width $x_i$, resistor 20 has conductance $\alpha x_i$ and capacitors 22 have capacitance $\beta x_i$, for two constants $\alpha$ and $\beta$.

The equivalent circuit of FIG. 3 comprises capacitors $C_i$, where $i=1 \ldots 25$. The circuit also has five identical voltage sources 32 connected to nodes of the circuit via resistors 30 having conductances $g_o$. The voltage across each source 32 is equal to U. It is desired to minimize an energy E dissipated by a transition of the circuit, where the transition corresponds to the voltage sources 32 undergoing a change from U=0 to U=1. The energy E dissipated by the transition is proportional to:

$$1^T C(x) 1 = \sum_{i=1}^{25} C_i + 2\beta \sum_{i=1}^{40} x_i \quad (10)$$

where 1 is a column vector, every entry of which is 1. The first sum in Eq.(10) refers to the energy stored in capacitors $C_1 \ldots C_{25}$; the second sum is proportional to the energy stored in the forty segments. In optimizing the circuit, it is desired that the width of each segment be between 0 and a maximum width $w_{max}$. The optimization method therefore comprises the following step:

use semi-definite programming techniques to minimize $1^T C(x) 1$, subject to $t_{max} G(x) - C(x) \geq 0$, and to $0 \leq x_i \leq w_{max}$, for $i=1 \ldots 40$.

For the purposes of this example, the values $g_0=1$, $\alpha=1$, $\beta=0.5$, and $w_{max}=1$ were chosen. The values of $C_i$ are given in Table 1.

TABLE 1

| $C_1 = 10$ | $C_2 = 2$ | $C_3 = 7$ | $C_4 = 5$ | $C_5 = 3$ |
| $C_6 = 8$ | $C_7 = 3$ | $C_8 = 9$ | $C_9 = 5$ | $C_{10} = 5$ |
| $C_{11} = 1$ | $C_{12} = 8$ | $C_{13} = 4$ | $C_{14} = 9$ | $C_{15} = 3$ |
| $C_{16} = 7$ | $C_{17} = 3$ | $C_{18} = 6$ | $C_{19} = 8$ | $C_{20} = 2$ |
| $C_{21} = 5$ | $C_{22} = 2$ | $C_{23} = 1$ | $C_{24} = 9$ | $C_{25} = 10$ |

The result of the optimization method is illustrated in FIGS. 5a and 5b. FIG. 5a represents an optimum configuration for $t_{max}=50$. The width of each segment (for example 101, 102, and 105) illustrated in FIG. 5a is appromately proportional to the optimum width of that segment. Not all of the forty segments are shown in FIG. 5a. The segments not shown have an optimum width of zero. This is an illustration of how the optimization method determines the topology of the circuit as well as the sizes of the elements.

FIG. 5b represents an optimum configuration for $t_{max}=100$. The topology of FIG. 5b is different from that of FIG. 5a. That is, the circuit acquires an optimum topology that depends on the value Of $t_{max}$.

The step of minimizing the dissipated energy was repeated for a number of values of $t_{max}$; the results are graphed in FIG. 6. The graph of FIG. 6, called a tradeoff curve, shows that there is a tradeoff between the dissipated energy and the dominant time constant: the smaller $t_{max}$ is, the greater is the dissipated energy. It will be clear to anyone practiced in the art how to extend the above example to a mesh of arbitrary size.

Figure 7:
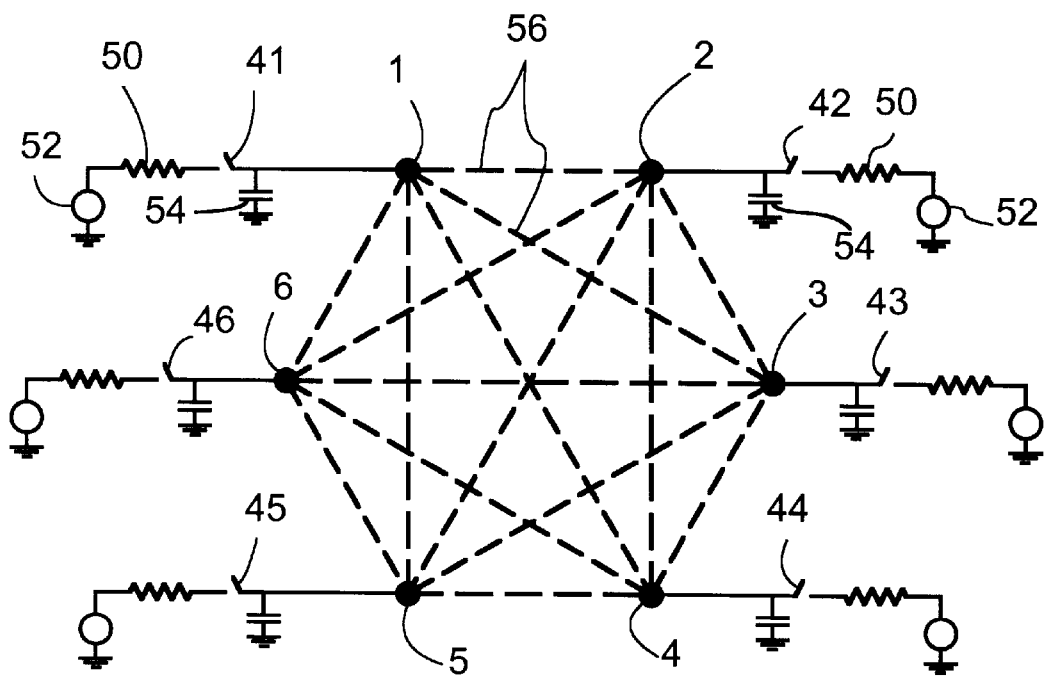
FIG. 7 shows an example of an equivalent circuit that models a tri-state bus. The equivalent circuit comprises nodes and connectors.

Example 4: A tri-state bus connecting six nodes is optimized. The equivalent circuit is shown in FIG. 7. The equivalent circuit comprises six voltage sources 52, six resistors 50, six capacitors 54, and switches 41, 42, 43, 44, 45, and 46. Resistors 50 have conductances $g_0$, and capacitors 54 have capacitances $c_0$. The equivalent circuit has nodes 1, 2, 3, 4, 5, and 6, and every pair of nodes is joined by a connector 56. The connectors 56 are shown as dashed lines in FIG. 7, and could be considered possible connectors, since some of the connectors will have optimum width zero, and therefore will not exist in the optimum circuit.

The connector linking the $i^{th}$ node to the $j^{th}$ node has length $l_{ij}$ and width $x_{ij}$. The design parameters for this example are the widths $x_{ij}$, for $i=2 \ldots 6$, $j=1 \ldots 6$, and $i>j$. Each connector 56 is modeled as shown in FIG. 4, by resistor 20 and capacitors 22. The connectors are modeled by two numbers $\alpha$ and $\beta$ such that for the connector linking the $i^{th}$ node to the $j^{th}$ node, resistor 20 has conductance $\alpha x_{ij}/l_{ij}$ and capacitors 22 have capacitance $\beta x_{ij}l_{ij}$.

The area of the circuit is to be minimized. Therefore property.

$$P = \sum_{i>j} l_{ij}x_{ij}.$$

The area is to be optimized for six transitions simultaneously. In a first transition, switch 41 is closed and switches 42–46 are open. In each of the other five transitions, one of the switches 42–46 is closed, and all other switches are open.

The conductance matrix G(x) for the first transition is equal to:

$$G(x) = \tilde{G}(x) + g_0 E_{11}$$

where $\tilde{G}(x)$ is a conductance matrix for the equivalent circuit of FIG. 7 with all the switches open, and $E_{11}$ is a matrix that is zero except for the first diagonal element, which is equal to one. Similarly, for the $k^{th}$ transition ($2 \leq k \leq 6$), $G^{(k)} = \tilde{G}(x) + g_0 E_{kk}$, where $E_{kk}$ is zero except for the $k^{th}$ diagonal element, which is equal to one.

Figure 8:
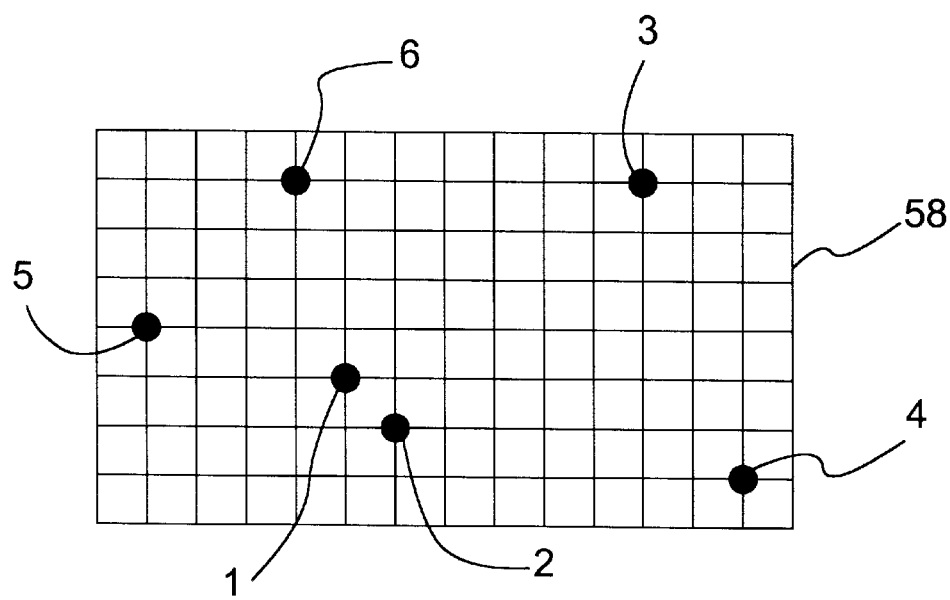
FIG. 8 shows a placement of the nodes of the equivalent circuit of FIG. 7.

The capacitance matrix C(x) is a diagonal matrix whose $i^{th}$ element is equal to the total capacitance at node i. In the optimization procedure, it is desired that the widths $x_{ij}$ fall in a range between 0 and 1. Therefore the optimization method comprises the following step:

use semi-definite programming techniques to minimize $$\sum_{i>j} l_{ij}x_{ij},$$

subject to $t_{max} (\tilde{G}(x) + g_0 E_{kk}) - C(x) \geq 0$, for k=1,2, . . . 6, and to $0 \leq x_{ij} \leq 1$ In the present example, the values $g_0=1$, $c_0=10$, $\beta=0.5$, and $\alpha=1$ were used. Nodes 1–6 are spaced as shown in FIG. 8. Nodes 1–6 are placed on a grid 58, and the length $l_{ij}$ of the connector between node i and node j is equal to the Manhattan distance between the two nodes. In other words, the distance between two nodes is measured not along a straight line, but along lines of grid 58 that connect the two nodes. For example, the distance between node 1 and node 2 is equal to two.

Figure 9A:
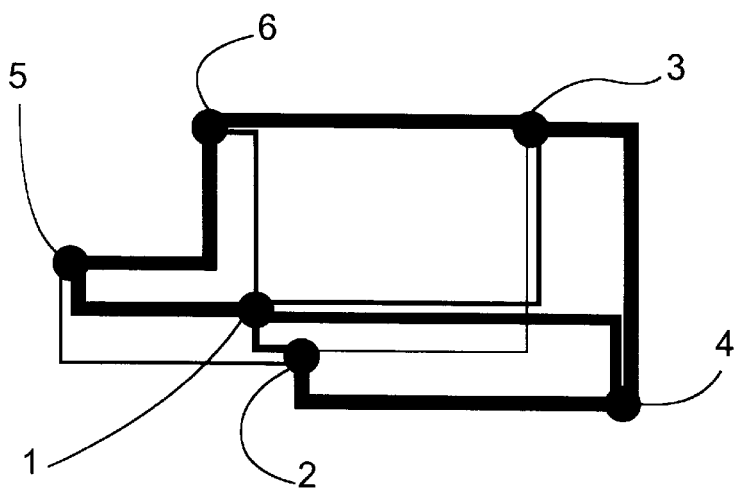
FIGS. 9a and 9b illustrate results of the optimization method applied to the equivalent circuit of FIG. 7.

The result of optimizing the area for the six transitions, using $t_{max}=410$, is shown in FIG. 9a. Connectors 56 are shown in FIG. 9a, the width of the connector between node i and node j being appromately proportional to the optimum value of the width $x_{ij}$. Not all of the connectors 56 are shown; those connectors not shown have optimum width equal to zero, and are therefore omitted from the circuit. This example provides another illustration of how the optimum topology of the circuit is determined by the optimization method.

Figure 9B:
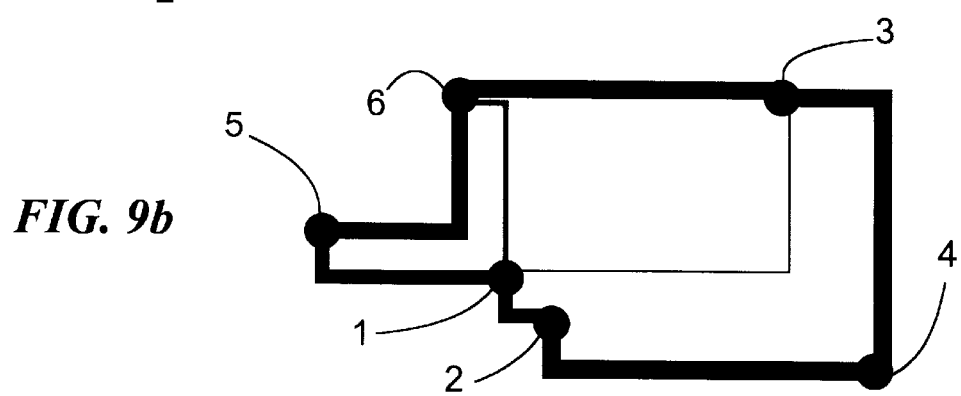

FIG. 9b shows the result of the optimization method for $t_{max}=2000$. The circuit of FIG. 9b has a topology different from the topology of the circuit of FIG. 9a. This again illustrates that the optimum topology can depend on the value of $t_{max}$.

Figure 10:
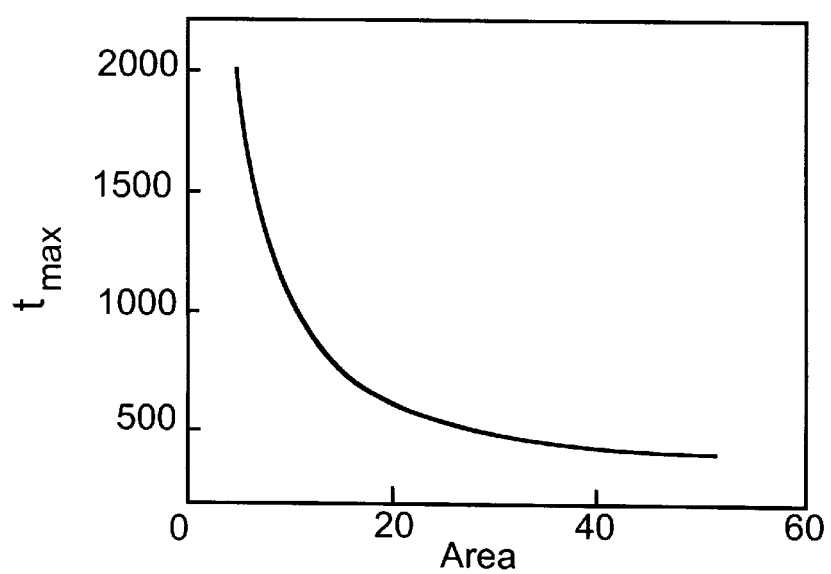
FIG. 10 shows a tradeoff curve of the optimization method applied to the equivalent circuit of FIG. 7.

The step of minimizing the area was carried out for a range of values of $t_{max}$; the results are shown in FIG. 10. The graph of FIG. 10 shows the tradeoff between $t_{max}$ and the area.

Figure 11:
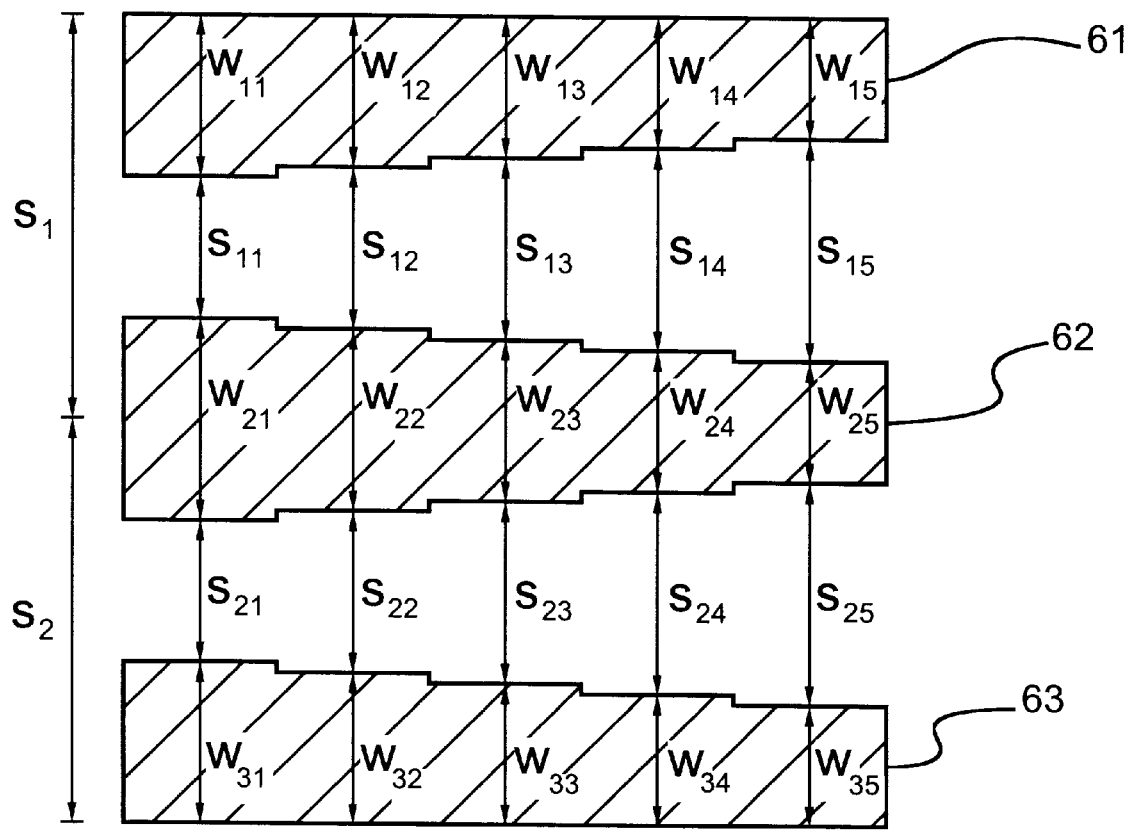
FIG. 11 is an illustration of three wires of an exemplary circuit.

Example 5: Wire sizes and spacings are optimized. As shown in FIG. 11, a first wire 61, a second wire 62, and a third wire 63 run parallel to each other. Each wire is divided into five segments; a width of a first segment of the first wire is $w_{11}$, a width of a second segment of the first wire is $w_{12}$, and so on, as shown in FIG. 11. Spacings $s_{ij}$ give distances between segments of adjacent wires, as shown. An edge of the first wire is a distance $s_1$ from a middle of the second wire, and the middle of the second wire is a distance $s_2$ from an edge of the third wire.

Figure 12:
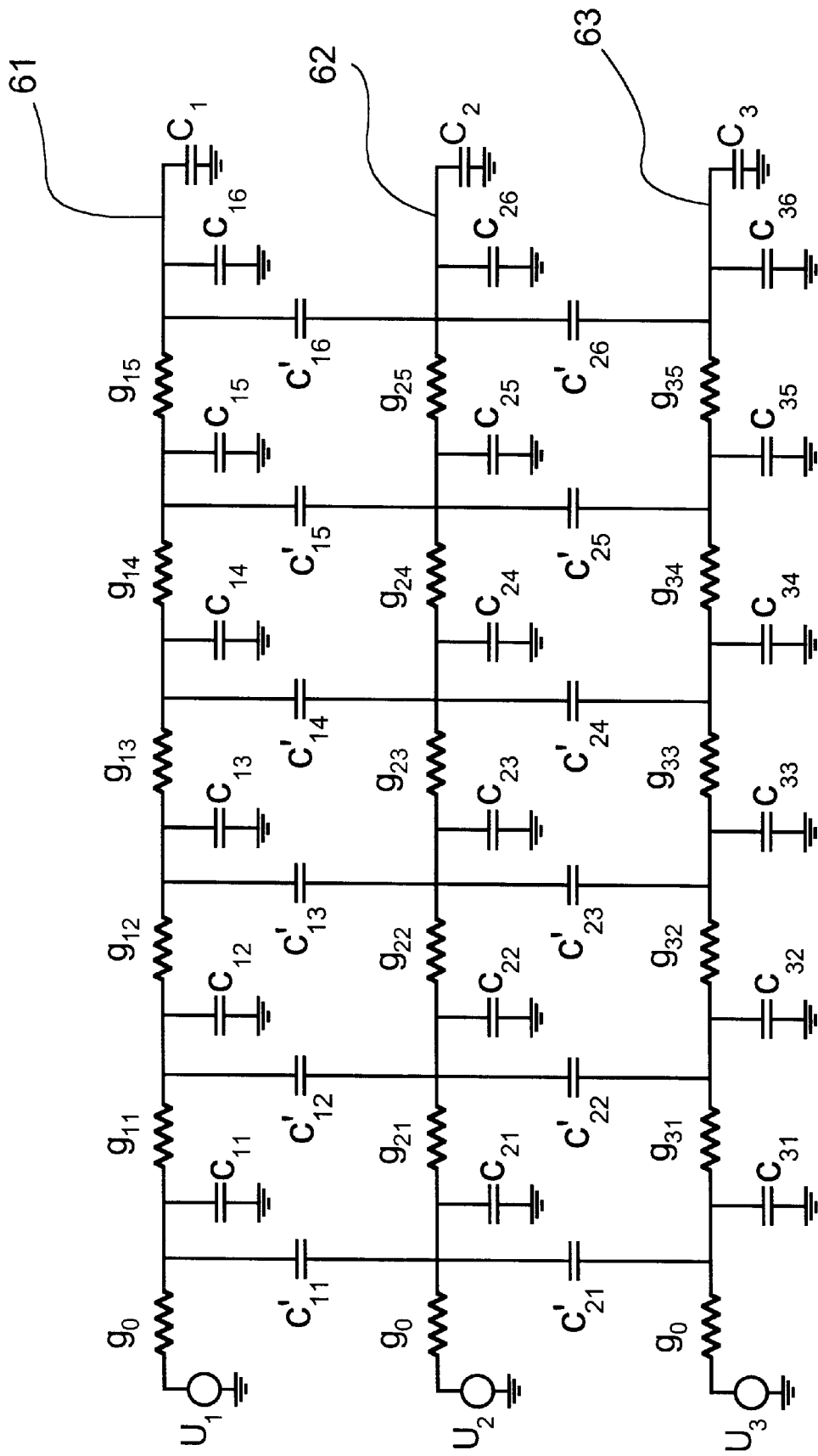
FIG. 12 is a schematic diagram of an equivalent circuit that corresponds to the wires of FIG. 11.

The equivalent circuit for this example is shown in FIG. 12. Each wire is modeled by resistors having conductance $g_{ij}$, and capacitors with capacitance $c_{ij}$. At one end, each wire is driven by a voltage source, $U_i$ for the $i^{th}$ wire, with output conductance $g_0$. Another end of each wire is connected to a capacitive load, $C_i$ for the $i^{th}$ wire. Capacitances $c_{ij}$ model the crosstalk between the wires.

The conductances $g_{ij}$ are given by $g_{ij} = \alpha w_{ij}$, for some model-dependent number $\alpha$. The values of the capacitances $c_{ij}$ are related to the widths $w_{ij}$ by a proportionality constant $\beta$. For i=1,2, or 3:

$$c_{i1} = \beta w_{i1}; \quad c_{i2} = \beta(w_{i1}+w_{i2}); \quad c_{i3} = \beta(w_{i2}+w_{i3});$$

$$C_{i4} = (w_{i3}+w_{i4}); \quad c_{i5} = \beta(w_{i4}+w_{i5}); \quad C_{i6} = \beta w_{i5}$$

The capacitances $c'_{ij}$ have the following values. For i=1 or 2:

$$c'_{i1} = \gamma/s_{i1}; \quad c'_{ij} = \gamma/s_{ij} + \gamma/s_{i(j-1)}) \text{ for } 1<j<6 c'_{i6} = \gamma/s_{i5}$$

for some parameter $\gamma$. A total width of the circuit, $s_1+s_2$, is to be minimized, subject to the following sizing constraints: each $w_{ij}$ is to be less than an upper bound $w_{max}$, and $s_1$ and $s_2$ are each to be greater than a minimum spacing $s_{min}$.

The spacings $s_{ij}$ cannot be used as design parameters, since the capacitances $c'_{ij}$ are not affine functions of the spacings $s_{ij}$. However, new variables $t_{ij}$ are defined such that $t_{ij} = 1/s_{ij}$. The capacitances $c'_{ij}$, and hence the capacitance matrix C, are affine functions of the new variables $t_{ij}$, so the optimization method may be used. The design parameters are the widths $w_{ij}$, the variables $t_{ij}$, and the spacings $s_1$ and $s_2$. The geometrical constraints, evident from FIG. 11, that $$s_{1j} = s_1 - w_{1j} - w_{2j}/2; \quad s_{2j} = s_2 - w_{3j} - w_{2j}/2, j=1 \ldots 5$$

can be replaced by inequalities for purposes of the optimization method:

$$1/t_{1j} \leq s_1 - w_{1j} - w_{2j}/2; \quad 1/t_{2j} \leq s_2 - w_{3j} - w_{2j}/2, j=1 \ldots 5$$

These inequalities can in turn be expressed as linear matrix inequalities:

$$\begin{pmatrix} t_{1j} & 1 \\ 1 & s_1 - w_{1j} - (w_{2j}/2) \end{pmatrix} \geq 0; \quad (11)$$

$$\begin{pmatrix} t_{2j} & 1 \\ 1 & s_{2j} - w_{3j} - (w_{2j}/2) \end{pmatrix} \geq 0$$

As will be clear to one skilled in the art, the constraints of Eq. (11), as well as the sizing constraints $$0 \leq t_{ij} \leq 1/s_{min}; \quad w_{ij} \leq w_{max} \quad (12)$$

can be expressed as design constraints $A \geq 0$, where the matrix A has a block diagonal form, and where the entries of the matrix A are determined by Eqs. (11) and (12).

The optimization method comprises the following step:

use semi-definite programming techniques to minimize $s_1+s_2$, subject to $t_{max}G-C \geq 0$;

$1/t_{1j} \leq s_1-w_{1j}-w_{2j}/2$; $1/t_{2j} \leq s_2-w_{3j}-w_{2j}/2$, $j=1 \ldots 5$;

$0 \leq t_{ij} \leq 1/s_{min}$, $i=1,2$; $j=1 \ldots 5$;

$w_{ij} \leq w_{max}$, $i=1,2,3$; $j=1 \ldots 5$.

The following values were used:

$g_0=100$, $C_1=10$, $C_2=20$, $C_3=30$, $\alpha=1$, $\beta=0.5$, $\gamma=2$, $s_{min}=1$, $w_{max}=2$.

Figure 13A:
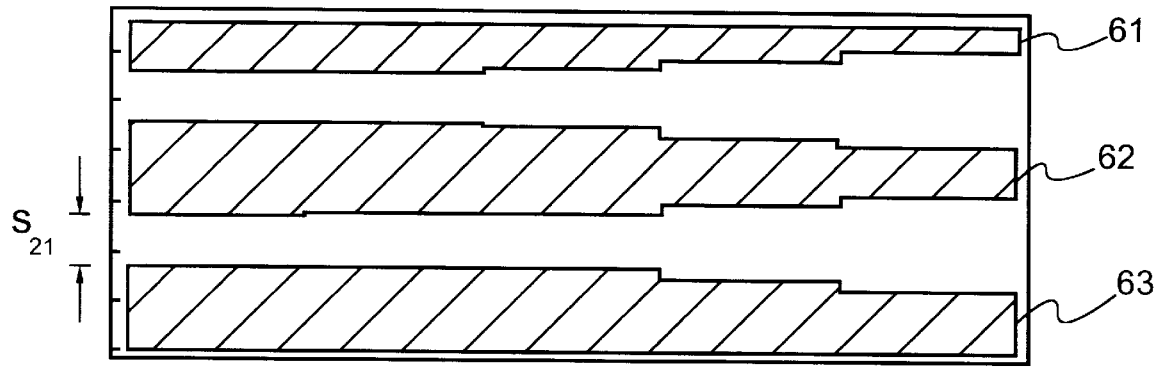
FIGS. 13a and 13b illustrate results of the optimization method applied to the wires of FIG. 11.
Figure 13B:
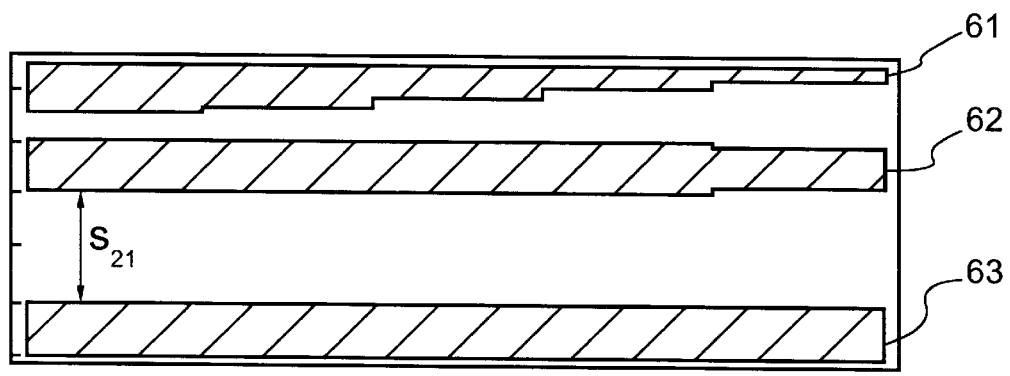

FIG. 13a shows the result of the optimization for $t_{max}=130$. In this case, the spacings $s_{11}$ and $s_{21}$, are equal to the minimum spacing of 1, and the crosstalk between the wires is inconsequential. FIG. 13b gives the result of the optimization when $t_{max}=90$. In this case $s_{21}=4$, so evidently the crosstalk was a factor in determining the optimum spacing between the wires.

We claim:

1. A method for optimizing a property of an integrated circuit, the method comprising the steps of:
   a) characterizing a physical layout of the integrated circuit by design parameters,
   b) finding values of the design parameters that optimize the property of the circuit, the design parameters being subject to a constraint $t_{max} G-C \geq 0$, wherein G is a matrix that expresses conductances of an equivalent circuit as an affine function of the design parameters, C is a matrix that expresses capacitances of the equivalent circuit as an affine function of the design parameters, and $t_{max}$ is a maximum dominant time constant, and
   c) constructing the integrated circuit with the values of the deign parameters found in step b).

2. The method of claim 1, wherein semi-definite programming techniques are applied to carry out the step of finding the values of the design parameters that optimize the property.

3. The method of claim 2, wherein the property is an area of the circuit.

4. The method of claim 2, wherein the property is a width of the circuit.

5. The method of claim 2, wherein the property is an energy dissipated by a transition of the circuit.

6. The method of claim 1, wherein generalized eigenvalue minimization techniques are applied to carry out the step of finding the values of the design parameters that optimize the property.

7. The method of claim 6, wherein the property is the maximum dominant time constant $t_{max}$.

8. The method of claim 1, wherein the design parameters are subject to design constraints.

9. The method of claim 1, wherein the equivalent circuit has a non-tree topology.

10. The method of claim 1, wherein the matrices G and C model a first transition of the circuit.

11. The method of claim 10, wherein the design parameters are additionally subject to a constraint $t_{max} G^{(2)}-C^{(2)} \geq 0$, wherein $G^{(2)}$ and $C^{(2)}$ are matrices that model conductances and capacitances, respectively, of a second transition of the circuit.

12. The method of claim 1, wherein the design parameters comprise widths of a set of elements of the circuit.

13. A method for optimizing a topology of an integrated circuit, wherein a physical layout of the circuit is described by design parameters, and wherein the method comprises the step of:
   a) finding values of the design parameters that optimize a property of the integrated circuit, the design parameters being subject to a constraint $t_{max} G-C \geq 0$, wherein $t_{max}$ is a maximum dominant time constant, and wherein G and C are matrices that model conductances and capacitances, respectively, of a first transition of the circuit, G and C being affine functions of the design parameters, and a first design parameter being related to a first element of the circuit, and
   b) constructing the integrated circuit with the values of the design parameters found in step a).

14. The method of claim 13, wherein semi-definite programming techniques are applied to carry out the step of finding the values of the design parameters that optimize the property.

15. The method of claim 13, wherein generalized eigenvalue minimization techniques are applied to carry out the step of finding the values of the design parameters that optimize the property.

16. The method of claim 13, wherein the design parameters are subject to design constraints.

17. The method of claim 13, wherein the design parameters are additionally subject to constraints $t_{max} G^{(j)}-C^{(j)} \geq 0$ for $j=2$ to r, wherein r is an integer greater than 1, and wherein $G^{(j)}$ and $C^{(j)}$ are matrices that model conductances and capacitances, respectively, of a $j^{th}$ transition of the circuit.

18. A digital integrated circuit characterized by design parameters $x_i$, a conductance matrix G, a capacitance matrix C, and a dominant time constant $T_{dom}$, wherein the conductance matrix G and the capacitance matrix C are affine functions of the design parameters $x_i$, and the values of the design parameters $x_i$ minimize the dominant time constant $T_{dom}$.

19. The circuit of claim 18, wherein the design parameters $x_i$ are subject to design constraints $A \geq 0$, wherein A is a matrix that is an affine function of the design parameters $x_i$.

20. The circuit of claim 19, wherein the design constraints comprise a requirement that a first design parameter $x_1$ lie within a specified range between a minimum value $x_{min}$ and a maximum value $x_{max}$.

21. The circuit of claim 19, wherein the design constraints comprise a requirement that a reciprocal of a spacing between first and second elements of the circuit lie within a specified range.

22. The circuit of claim 19, wherein the design constraints comprise a bound on an area of the circuit.

23. The circuit of claim 19, wherein the design constraints comprise a bound on a width of the circuit.

24. The circuit of claim 19, wherein the design constraints comprise a bound on an energy dissipated by the circuit.

25. The circuit of claim 18, wherein the circuit has a non-tree topology.

26. The circuit of claim 18, wherein the design parameters comprise widths of a set of elements of the circuit.

* * * * *